(12) United States Patent
So (10) Patent No.: US 6,342,822 B1
(45) Date of Patent: Jan. 29, 2002

(54) METHOD AND APPARATUS FOR IMPLEMENTING IMPROVED PULSE WIDTH MODULATION

(75) Inventor: John S. K. So, Fremont, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/724,706

(22) Filed: Nov. 28, 2000

(51) Int. Cl.[7] .............................. H03K 7/08; H02J 7/04
(52) U.S. Cl. ........................................ 332/109; 320/145
(58) Field of Search .................. 332/109–111; 327/175; 375/238; 320/145

(56) References Cited

U.S. PATENT DOCUMENTS

| | | |
|---|---|---|
| 5,014,016 A | 5/1991 | Anderson |
| 5,113,158 A | 5/1992 | Tsuji et al. |
| 5,192,922 A | 3/1993 | Jordan |
| 5,298,871 A | 3/1994 | Shimohara |
| 5,363,406 A | 11/1994 | Han |
| 5,402,060 A | 3/1995 | Erisman |
| 5,428,639 A | 6/1995 | Orbach et al. |
| 5,438,303 A | 8/1995 | Murakami et al. |
| 5,581,204 A | 12/1996 | Olsen |
| 5,650,925 A | 7/1997 | Hesterman |
| 5,675,297 A | 10/1997 | Gose et al. |
| 5,850,137 A * | 12/1998 | Takimoto et al. ........... 320/164 |
| 5,880,644 A | 3/1999 | Schmidt et al. |
| 5,886,586 A | 3/1999 | Lai et al. |

FOREIGN PATENT DOCUMENTS

| | | |
|---|---|---|
| JP | 55-25554 | 2/1977 |
| JP | 55-140327 A | 11/1980 |
| JP | 56-134828 A | 10/1981 |
| JP | 61-29211 A | 2/1986 |

* cited by examiner

*Primary Examiner*—David Mis
(74) *Attorney, Agent, or Firm*—Babak S. Sani; Townsend and Townsend and Crew LLP (57) ABSTRACT

A method and apparatus for implementing an improved pulse width modulation circuit is disclosed. In particular, a circuit and method is provided to generate a pulse width modulated signal, wherein the circuit and method significantly reduce susceptibility to transient noise effects. The pulse width modulator according to the present invention operates at high frequencies and over a full duty cycle range of 0% to 100%. Furthermore, automatic self-correction logic is also disclosed for pulse width modulated circuits wherein the self-correction logic prevents fault conditions.

15 Claims, 6 Drawing Sheets

METHOD AND APPARATUS FOR IMPLEMENTING IMPROVED PULSE WIDTH MODULATION

BACKGROUND OF THE INVENTION

The present invention relates in general to integrated circuits, and in particular to electronic devices using pulse width modulation ("PWM") techniques.

Pulse width modulation is a common circuit technique whereby information is carried by varying the width of the pulse in a periodic signal. A typical circuit application for PWM signals is in the control of switching regulators. Switching regulators, which are also called switch-mode regulators, are employed in power supply design where high power and high efficiency are important. With PWM controlled regulators, the frequency is held constant and the width of each pulse is varied to form a fixed-frequency, variable-duty cycle operation. The output of the PWM circuitry is used to control the switching of one or more pass transistors with very small internal resistance.

Figure 1:
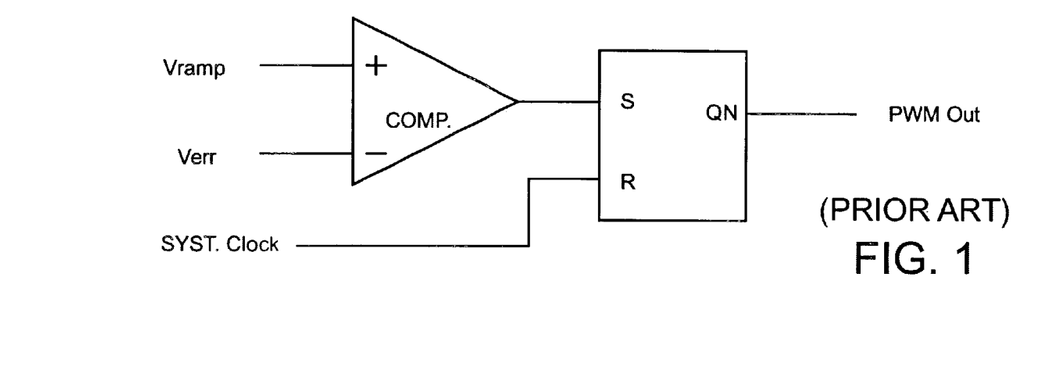
FIG. 1 shows a simplified schematic of a prior art pulse width modulator.
Figure 2:
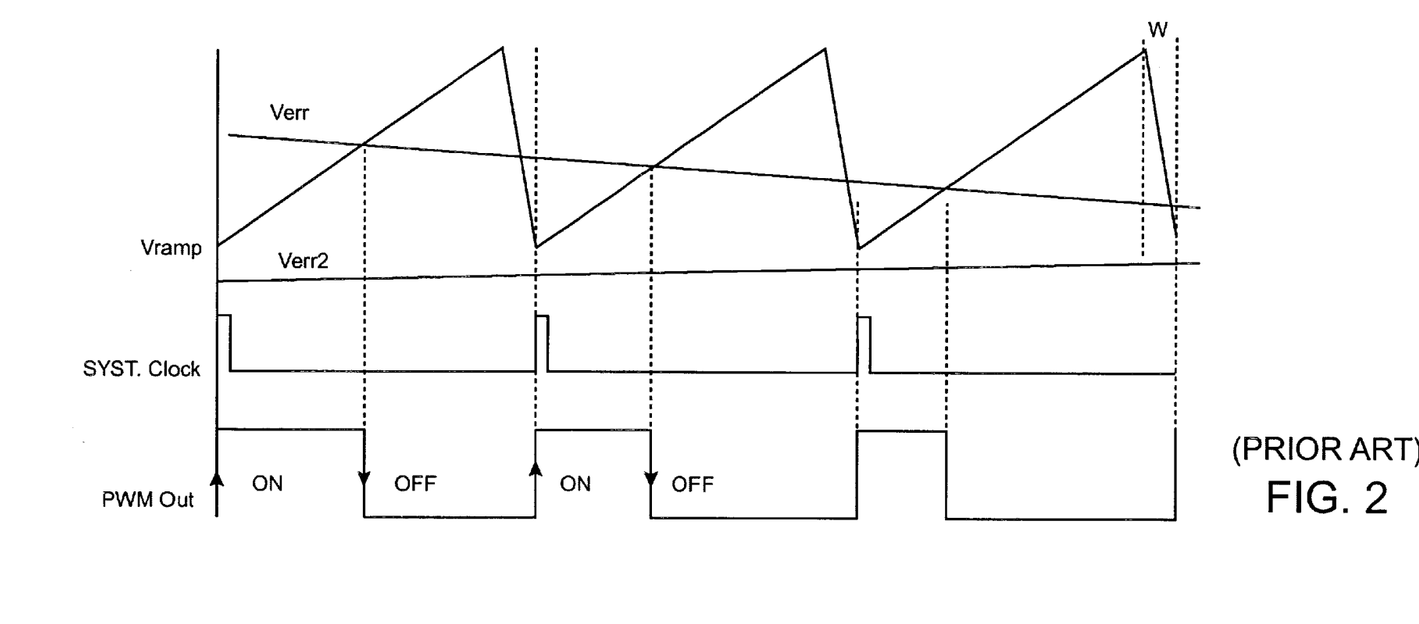
FIG. 2 shows a simplified timing diagram associated with the pulse width modulator of FIG. 1.

A conventional circuit using PWM techniques in switching regulator is shown in FIG. 1. In operation, the comparator evaluates a predetermined reference ramp signal Vramp against a feedback error voltage signal, Verr, to control the output through a latch (e.g., S-R flip flop), the latch operating as what is known in the art as a noise or multiple pulse suppresser. It should be understood that multiple pulsing is used interchangeably with double pulsing. When Vramp>Verr, the comparator switches the output off and thus controls one edge of the latch output as shown in FIG. 2. The control of the other edge of the latch output (i.e., turn-on) is performed using a fixed-frequency system clock (e.g., Syst. Clock). As a result, the PWM Out signal is not affected by the inadvertent application of spurious multiple pulses to the flip-flop set input.

Although the above-described configuration effectively generates a pulse width modulated signal for switching regulators, it has its disadvantages. For example, to achieve large duty cycles (e.g., 90% or more) for proper operation of the switching regulator, this scheme employs a sawtooth waveform as a Vramp signal. Vramp is generated by an oscillator synchronized with the system clock to produce such a sawtooth waveform of FIG. 2.

As switching frequencies increase in systems using PWM, however, the maximum duty cycle of the design is limited to less than a 100% duty cycle capability. At higher frequencies, the conventional PWM signal generation circuit becomes limited by the rate of the discharge slope of the sawtooth ramp generator (not shown). Thus, a pulse width "W," as depicted in FIG. 2, is an unusable portion of the duty cycle that restricts the operation range (i.e., less than 100%) of the PWM output. Hence, the conventional approach is frequency limited and is thus inadequate for system applications where higher frequencies are employed.

Therefore, there is a need in the art for an inventive circuit and method for suppressing transient noise effects on the device output resulting in multiple pulses, while achieving a 100% duty cycle.

SUMMARY OF THE INVENTION

The present invention provides an improved pulse width modulator for high speed circuits such as switching regulator circuitry. The pulse width modulator according to the present invention employs a triangular wave oscillator system and provides multiple pulse suppression for proper system operation at high frequencies over a full duty cycle range (i.e., up to 100%). Furthermore, the modulator includes automatic self-correcting circuits to prevent the output from becoming stuck in an error state (i.e., fault condition) for more than half of the switching frequency cycle. Accordingly, in one embodiment, the present invention provides a pulse width modulator for use in, for example, DC-to-DC switching regulation circuitry, the pulse width modulator includes a comparator coupled to receive a control signal and a reference ramp signal and is configured to generate a pulse width control signal. The pulse width modulator also includes a noise suppression circuit coupled to receive a periodic signal and to an output of the comparator and configured to further provide a pulse width modulated signal. Transitions of the periodic signal coincide with either a maximum or a minimum amplitude of the ramp signal. Furthermore, the control signal is a feedback error voltage control signal and the reference ramp signal is a fixed frequency triangular reference ramp.

In another embodiment of the pulse width modulator, the noise suppression circuit further comprises a set logic path having a first set input coupled to the comparator output to receive the pulse width control signal and a second set input coupled to receive a periodic signal and a set output, a reset logic path having a first reset input coupled to receive a periodic signal and a second reset input coupled to receive the pulse width control signal and a reset output, and a set-reset circuit latch having a first input coupled to the set output and a second input coupled to the reset output and a set-reset circuit output, wherein the set-reset circuit output is configured to provide the pulse width modulated signal.

The present invention also provides a method of generating a pulse width modulated signal comprising generating a reference ramp signal, comparing the reference ramp signal to a control signal, generating a pulse width control signal upon a pre-determined event as a result of comparing the reference ramp signal to a control signal, and generating one leading edge and one trailing edge of the pulse width modulated signal for each cycle of the periodic signal based upon the pulse width control signal and a periodic signal, wherein the leading edge and the trailing edge are generated by a noise suppression circuit.

A better understanding of the nature and advantages of the present invention may be had with reference to the detailed description and drawings below.

DESCRIPTION OF THE SPECIFIC EMBODIMENTS

The following detailed description of specific embodiments, including preferred embodiments, reference the accompanying drawings that form part of this disclosure. The drawings illustrate examples of electronic devices, circuits and methods embodying the novel and non-obvious aspects of the invention. Specific embodiments of exemplary pulse width modulator circuitry, as they pertain to high frequency system operation and methods, and prevention of fault conditions of systems employing PWM, are also disclosed. Without departing from the scope of the present invention, other embodiments may be used in place of those shown and described, and such substitutions should be apparent to those skilled in the art upon reading this disclosure.

Figure 3A:
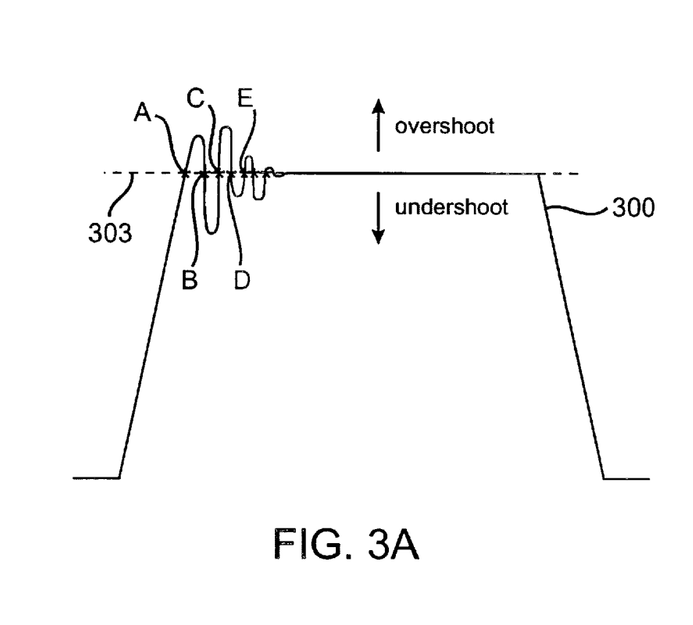
FIGS. 3A and 3B illustrate the generation of double (or multiple) pulses at a PWM output caused by transient signals or noise.
Figure 3B:
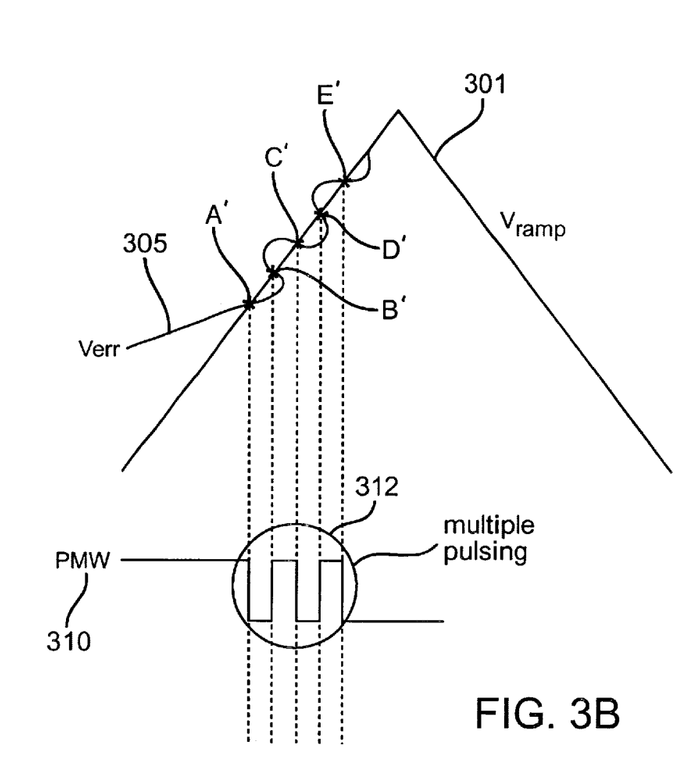

The present invention addresses the frequency and duty cycle limitations of the prior art by replacing the sawtooth reference signal with a triangular wave oscillator in order to achieve stable system operation at higher frequencies. Furthermore, the present invention includes a specific embodiment for suppressing transient noise conditions fed into the comparator by way of the error signal, Verr, as explained below. FIGS. 3A and 3B illustrate the effects of noise upon the generated pulse width modulated signal. As shown in FIG. 3A, for a particular output signal 300, noise causes fluctuations about a pre-determined output level 303. Specifically, the output can have overshoot deviation points A, C, E, etc., and undershoot deviation points B, D, etc.

As described herein, a deviation point refers to an event where the application output deviates from a desired level at certain points in time. In turn, each deviation point corresponds to a respective "cross-point." A cross-point occurs when the error signal magnitude and the ramp signal magnitude are equivalent and are thus associated with A', B', C', D' and E' in FIG. 3B. Since the deviation points influence the characteristics of feedback signal Verr 305, the deviation points affect the generation of the pulse width modulated signal. When the feedback signal is compared with triangular reference ramp signal 301, the resulting pulse width modulated signal 310 will include double or multiple pulses 312 as shown in FIG. 3B. Multiple pulsing effects lead to improper control of the subservient circuitry, such as a switching transistor.

Figure 4:
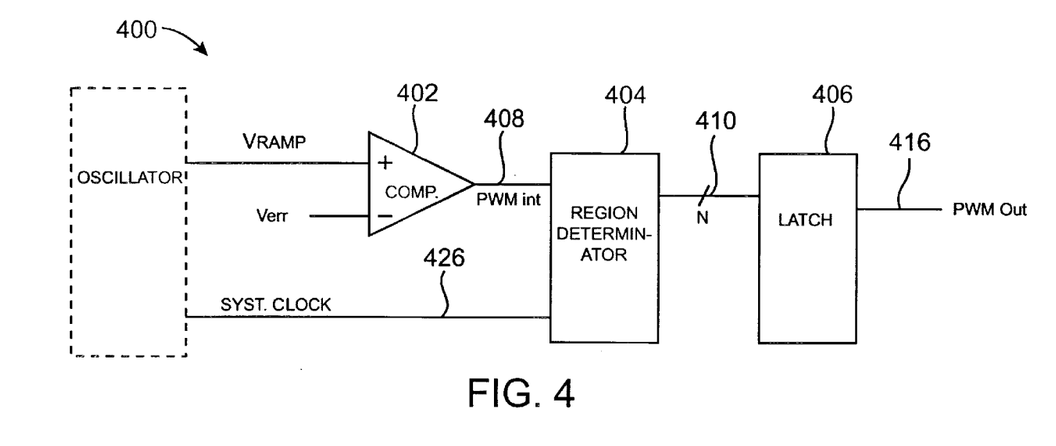
FIG. 4 is a simplified block diagram illustrating an exemplary pulse width modulator circuit according to the present invention.

FIG. 4 shows a specific embodiment of pulse width modulator 400 that includes comparator 402, region determinator 404 and latch 406. The region determinator according to the present invention divides a period of time into two or more portions, or regions. A "region" as described herein is a duration of time of the partitioned period of a particular signal, such as the system clock. In another embodiment, region determinator 404 splits the period of the reference ramp signal, Vramp, into two or more regions of time. For example, in an embodiment having two regions, each region is associated with the slope of the reference ramp signal. In this case, a first region and a second region correspond, respectively, to the positive slope and the negative slope of a triangular reference ramp signal. Furthermore, for each region, the region determinator provides only a select type of signal characteristics at each of its outputs. That is, an output of the exemplary region determinator may provide only either the rising edge, or the falling edge, for a particular region. The separated rising and falling edge information is used to construct a pulse width modulated signal as described below.

Region determinator 404 is configured to receive both PWMint 408 and a system clock signal, and is electrically coupled to latch 406 by interconnect 410. Interconnect 410, for example, comprises "n" number of interconnects between region determinator 404 and latch 406. In operation, region determinator 404 first monitors whether one or more "cross-points" occur during a cycle of system clock. A "cross-point" is a point in time where Verr is equal to Vramp as determined by comparator 402, which is described in more detail below. Second, region determinator 404 determines in which region (e.g., positive ramp or negative ramp) the one or more cross-points arise. Third, the region determinator then outputs signals having pulse edges incident with the particular cross-points for a corresponding region.

Figure 6:
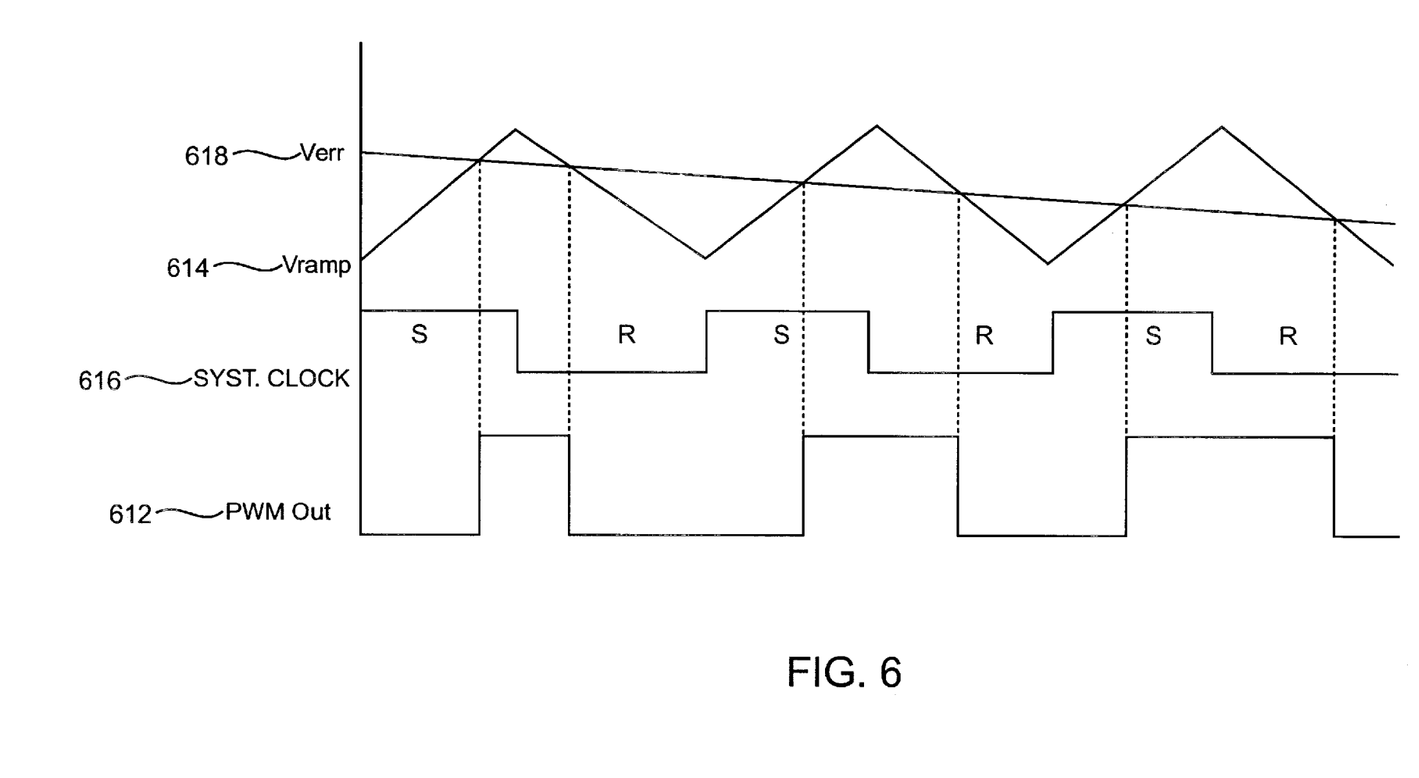
FIG. 6 is a timing diagram illustrating the generation of a PWM signal by the pulse width modulator of FIG. 5.

In a specific embodiment having two regions per period of time, one region is denoted the "S-region" during the set portion (i.e., "turn-on") of the cycle and another region is denoted the "R-region" during the reset portion (i.e., "turn-off") of the cycle. Alternating S-regions and R-regions are shown in FIG. 6. In one embodiment, where system clock 616 and Vramp 614 are synchronized, an S-region may correspond to either the slope of ramp signal 614 or to the high state of system clock 616. For example, if Vramp 614 is a triangular waveform, during the time its slope is positive (i.e., ramping-up), then any cross-points during that time occur during the S-region. Likewise, a negative slope or a low state of the system clock may be associated with cross-points during an R-region. FIG. 6 further illustrates an exemplary set of signals (Verr 618, Vramp 614, system clock 616) wherein the associated S- and R-regions are shown adjacent the system clock signal. According to FIG. 4, region determinator 404 outputs an "n" number of signals 410 including an S-signal and an R-signal. In one embodiment of the S- and R-signals, each comprises a pulse train having leading and trailing edges only during the respective S- and R-regions.

Figure 7:
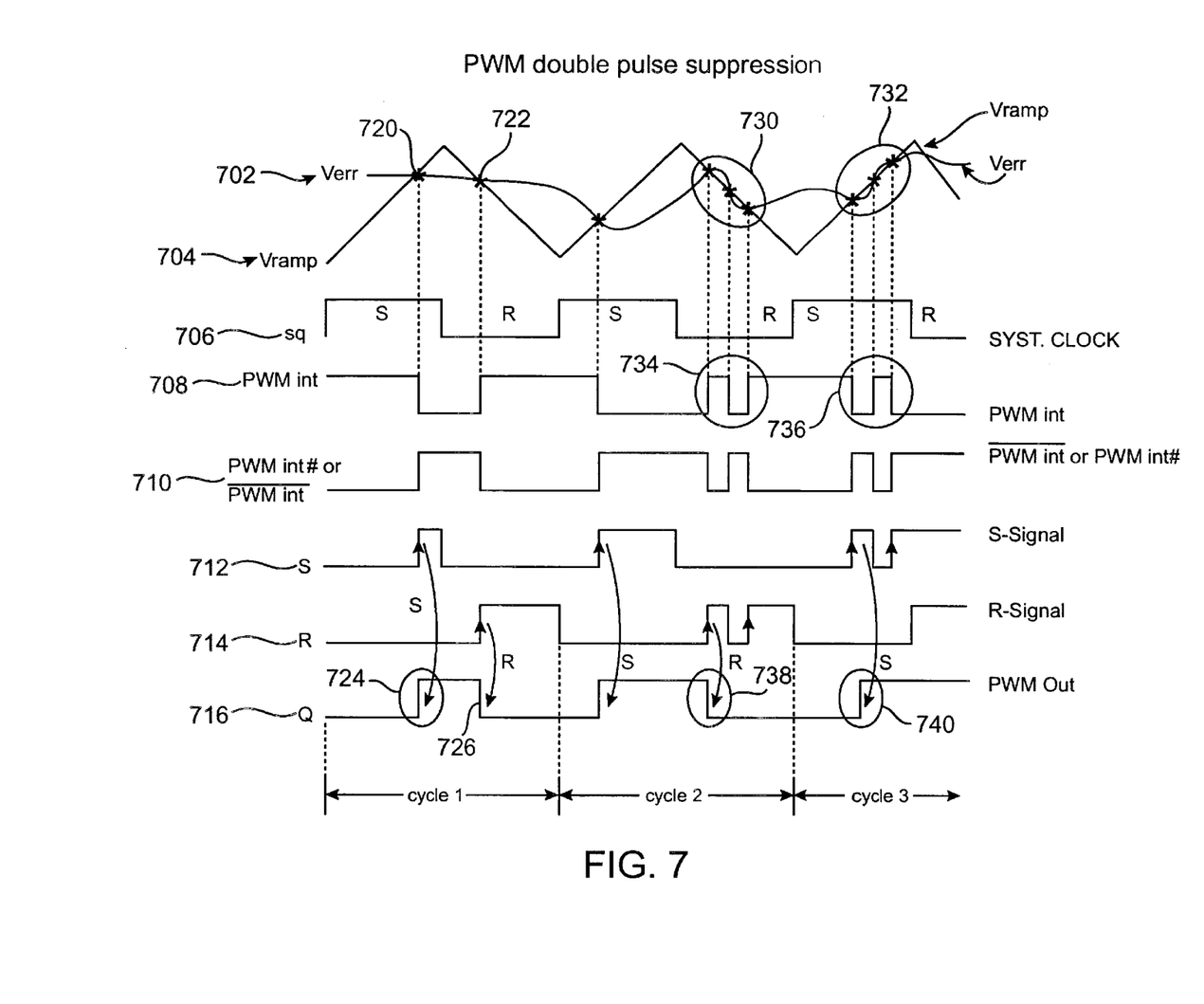
FIG. 7 is a timing diagram illustrating the operation of the pulse width modulator according to an embodiment the present invention.

The generation of the pulse width modulated signal, according to the present invention, begins by configuring comparator 402 to receive Vramp and Verr, and electronically coupling comparator 402 to deliver an intermediate PWM signal, PWMint 408. PWMint 408 is a signal that embodies information describing the cross-points between the error signal, Verr, and the ramp signal, Vramp. Such information would convey the occurrence of a point in time at which Verr=Vramp. PWMint 408 is a pulse train with its leading and trailing pulse edges coinciding with a plurality of cross-point events. The signal PWMint 408 is applied to the region determinator 404. Referring to FIG. 7, the signal PWMint 708 is characterized by rising and falling edges coinciding with a number of cross-point events 730 and cross-point events 732 occurring in R-region 734 and in S-region 736, respectively.

Referring back to FIG. 4, region determinator 404 is coupled to a source of a periodic system clock signal 426. The signal Vramp is generated by an oscillator (not shown) synchronized with periodic system clock signal 426. The timing of the ramp signal is used as a reference in which to compare with other signals, such as the periodic system clock, and characteristically has a linearly increasing and/or linearly decreasing slope as a function of time. In one embodiment, reference ramp signal Vramp is a triangular waveform that may have a variable frequency and a variable amplitude. In another embodiment, the same oscillator circuitry provides both the reference ramp signal Vramp and the periodic system clock 426. As the reference ramp signal increases with time (i.e., a positive slope), the oscillator outputs a system clock state having a high-level magnitude. As described herein, a high-level magnitude, for example 3.3 volts, is relative to a low-level magnitude, such as zero volts. Intermediate values of system clock and the ramp signal are also disclosed in accordance to the present invention. As the ramp signal decreases with time (i.e., a negative slope), the oscillator outputs a system clock having a low-level magnitude (e.g., zero volts).

In yet another embodiment, the oscillator operates to generate the system clock and Vramp signals, wherein both signals have the same duty cycle, such as 50% ON and 50% OFF. In still yet another embodiment, if signals Vramp and the system clock are synchronized, the signals are capable of spanning the full range of duty cycle without circuit malfunction. For example, Vramp and the system clock are timed to track each other and are capable of having duty cycles from 0% to 100%, inclusively. The term duty cycle is a ratio well understood in the art to be the ratio of the ON time of a periodic signal to the duration of a full period.

Latch 406 is coupled to receive the S- and R-signals from region determinator 404 and is configured to generate the leading and trailing edges of PWM Out 416. Latch 406 operates to output only a single leading edge and only a single trailing edge during the respective S- and R-region. Latch 406 is signal blocking logic added to prevent unwanted transient noise from affecting, for example, the switching circuitry of the application employing the present invention. In particular, the first and only the first cross-point during the S-region will generate a leading edge of PWM Out 416. Likewise, the first and only the first cross-point during the R-region will generate a trailing edge of PWM Out 416. Therefore, latch 406 functions to output a single pulse train wherein the leading and trailing edges relate to only the first cross-point per region during each cycle.

In one embodiment of region determinator 404, the region determinator comprises automatic self-correction logic which prevents the PWM Out signal 416 from being stuck at a certain error logical state (i.e., stuck-at fault) especially when Vramp and Verr signals do not cross each other and remain unequal. For example, system operation may enter an error state or fault condition if the Verr signal stays well above or below the amplitude of Vramp, such as immediately after device initialization (i.e., power-up sequence), or during sudden change of input voltage or output loading. Unlike convention circuits and methods for controlling switching regulators, the present invention provides a circuit that delivers an improved pulse width modulated control signal which prevents the system from entering such fault conditions, thus ensuring proper system operation.

Figure 5:
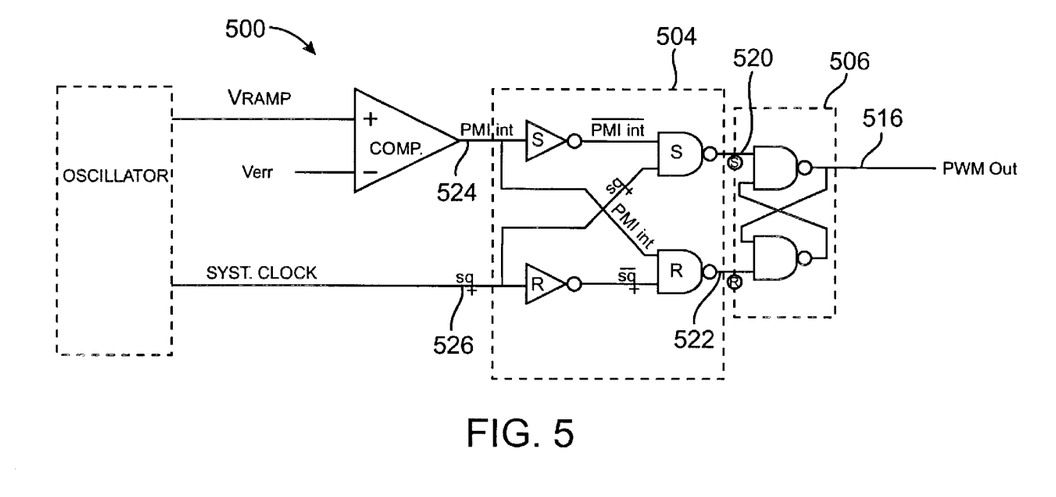
FIG. 5 shows an exemplary circuit implementation for a pulse width modulator circuit according to the present invention.

FIG. 5 shows a specific embodiment of pulse width modulator 500 including region determinator 504 and latch 506. In operation, region determinator 504 and latch 506 function similarly to region determinator 404 and latch 406, respectively. Region determinator 504 is coupled to receive PWMint 524 and system clock 526 at each of the respective set and reset logic path inputs. The region determinator operates to generate an S-signal and an R-signal, according to the logical expressions as found in equations 1 and 2.

$$\text{S-Signal} = \text{PWMint} \vee \overline{\text{Syst.Clk}} \qquad \text{Equation 1}$$

$$\text{R-Signal} = \overline{\text{PWMint}} \vee \text{Syst.Clk} \qquad \text{Equation 2}$$

Latch 506 of the present invention, in combination with region determinator 504, operates to eliminate multiple pulse edges (e.g., "double pulses") in each region due to transient noise. Latch 506 is, for example, a Set-Reset Latch ("S/R" flip-flop) which has logical characteristics generally known in the art. The latch is configured to receive S-region signal 520 and R-region signal 522, whereby each signal comprises a pulse train having leading and trailing edges only during the respective S- and R-regions. Latch 506 functions to select and output the first (and only the first) leading or trailing edge occurring in the respective region. For example, during the S-region, the latch outputs the leading edge of the pulse width modulated signal and during the R-region, the latch outputs the trailing edge of the pulse width modulated signal. The present invention therefore generates a control signal, unadulterated by feedback noise, which allows system operation at high frequencies.

In an exemplary embodiment of pulse width modulator 500, region determinator 504 includes a set logical path having an S inverter and an S NAND logic gate and a reset logical path having an R inverter and an R NAND logic gate. Automatic self-correction logic which prevents fault conditions is realized by introducing system clock 526 into the set logical path. The self-correcting feature according to one embodiment of the present invention includes a region determinator 504 configured to detect the output state of comparator 524 each time system clock 526 indicates boundary crosses from the S- to R-region or from the R- to S-region. In the case of Verr drifting below the amplitude of Vramp after the PWM Out signal was turn-on in the S-region, the output state of comparator PWMint 524 transitions to high level after this event (i.e., Verr<Vramp). During the time of the period when Vramp crosses the boundary of S- and R-region, the system clock sq 526 changes state from a high to low state. The high output state of PWMint 524 coupled with the inversion of the system clock sq 526 to a high state yields a low state appearing at the output of the R NAND logic 522. Also, the inversion of the PWMint 524 to a low state yields a high state appears at the output of the S NAND logic 520. PWM Out 516 will turn to a low state under such conditions. Even when there is no cross-point between Verr and Vramp, the region determinator 504 detects and corrects the PWM Out 516 to the preferable state automatically.

FIG. 7 shows the detailed timing relationships of S-signal 712 and R-signal 714 to Vramp 702, Verr 704, Syst. Clk. sq 706, PWMint 708 and PWMint# 710. Also shown is the pulse width modulator output signal PWM Out 716. During an exemplary first cycle shown in FIG. 7, cross-point 720 and 722 fall within the S- and R-region, respectively. Hence, cross-point 720 generates leading edge 724, and cross-point 722 generates trailing edge 726 of the pulse train for signal PWM Out 716.

Furthermore, FIG. 7 shows the effect of multiple cross-points during a particular region. During operation, an exemplary pulse width modulator circuit includes a feedback signal which is subject to transient noise from a variety of sources, such as an increase in current flow (i.e., fly-back voltage) generated by an inductive load. When transient noise is present at a device output, such noise may be fed back into the pulse width modulator circuit. For example, multiple R-region cross-points 730 and multiple S-region cross-points 732 are shown when Verr crosses Vramp multiple times during a specific region. Without the implementation of the present invention, the pulse width modulator output signals would be "double pulsed" in R-region 734 and in S-region 736. Such double-pulsing (or multiple-pulsing) is suppressed as shown in the corresponding trailing edge 738 and leading edge 740 of PWM Out 716. Hence, the present invention provides a PWM signal for controlling application-specific circuitry which requires it to be unaffected by noise.

Figure 8:
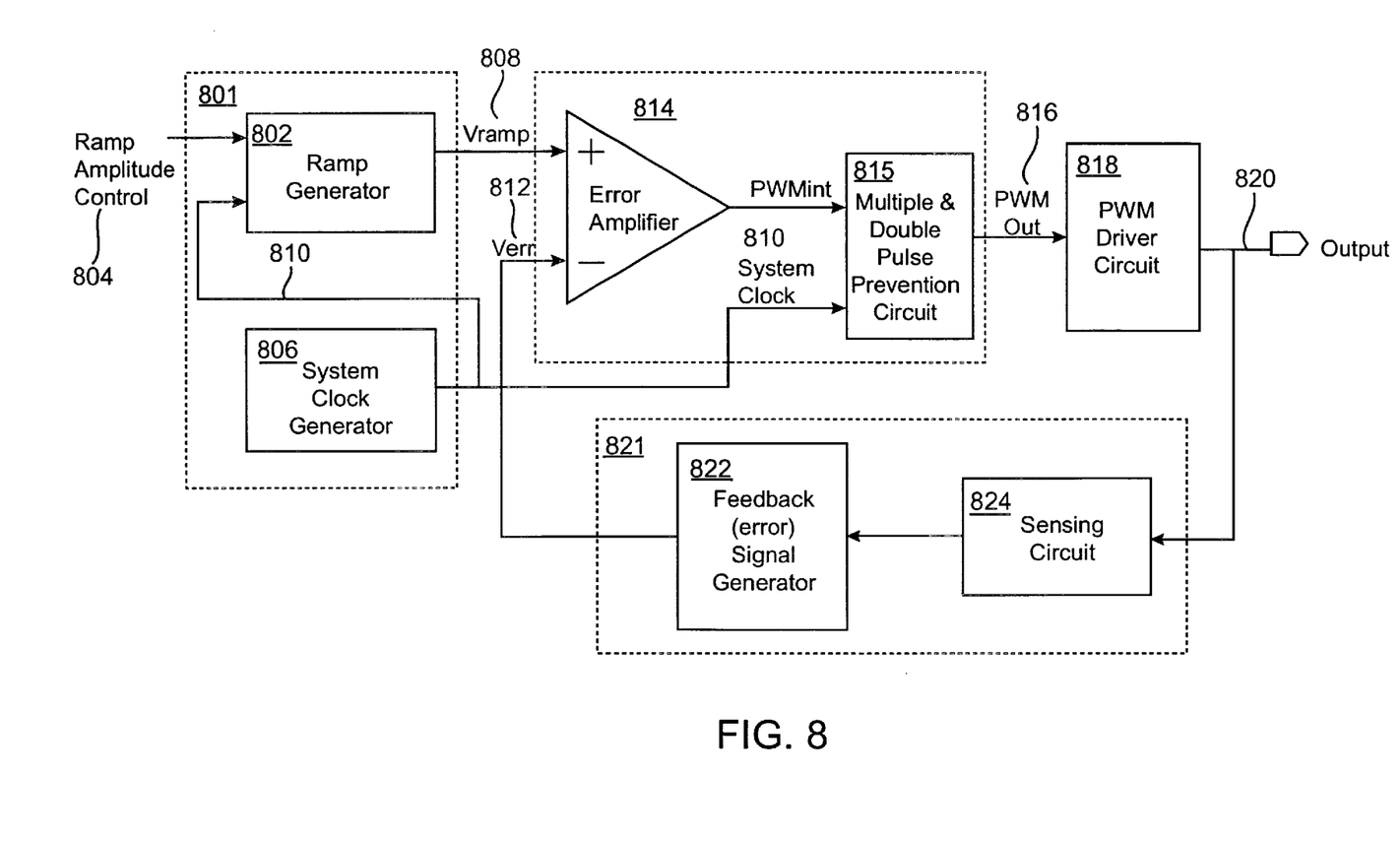
FIG. 8 is a simplified block diagram illustrating a portion of an electronic device using a pulse width modulator according to one embodiment of the present invention.

FIG. 8 is a simplified block diagram showing a portion of an exemplary electronic device, such as a DC-to-DC converter or a battery charger, employing the present invention. FIG. 8 shows a timing generator 801, PWM circuit 814, PWM driver circuit 818 and feedback circuit 821. Timing generator 801 is electrically coupled to deliver one or more timing signals to PWM circuit 814. PWM circuit 814 is coupled to PWM driver circuit 818 for delivering signal PWM Out 816 to control or regulate output 820. Lastly, feedback circuit 821 is coupled between output 820 and PWM circuit 814 to generate and provide error signal 812 ("Verr") to the PWM circuit.

Timing generator 801 includes ramp generator 802 for generating ramp signal 808 ("Vramp") and system clock generator 806 for generating system clock signal 810. Timing generator 801 is configured to deliver internally system clock signal 810 from system clock generator 806 to ramp generator 802 and to provide externally system clock signal 810 for use by multiple pulse prevention circuit 815. Timing generator 801 is configured also to deliver externally Vramp 808 to PWM controller circuit 814. Timing generator 801 is configured further to supply system clock signal 810 to the same PWM circuit 814. In one embodiment of timing generator 801, ramp generator 802 and system clock generator 806 are configured to receive ramp amplitude control signal 804 generated by a ramp amplitude controller (not shown). Ramp amplitude control signal 804 functions to vary the amplitude of the ramp signal. In a specific embodiment, system clock generator 806 operates to determine the characteristics of generating periodic system clock signal 810. Ramp generator 802 is, for example, an oscillator that provides a timing waveform, such as a triangular waveform.

Exemplary PWM circuit 814 is configured as shown in FIGS. 4 and 5 and employs the present invention to generate PWM Out 816. PWM Out 816 signal controls other circuitry, such as PWM drive circuit 818, wherein the PWM drive circuit is electrically coupled to PWM circuit 814. In particular, PWM Out is a modulated signal having pulse widths varying according to the amount of control required by PWM drive circuit 818. An exemplary PWM drive circuit is, for example, a MOSFET driver output driving the gate of one or more power MOSFETs for switching the one or more power MOSFETs on and off. (not shown).

Feedback circuit 821 is configured to monitor the output of the exemplary device in which the present invention resides, and to generate an error signal for correcting deviations in output from a pre-determined level. Feedback circuit 821 includes monitoring circuit 824 (i.e., sensing circuit) and feedback signal generator 822 (i.e., error signal generator). The monitoring circuit 824 senses the conditions at a particular location after the device output 820 under load conditions, such as conditions where the actual device output deviates from a desired level.

The pulse width of PWM Out 816 is adjusted to turn the MOSFET on for a period of time through the PWM driver circuit 818 to reach and to maintain a pre-determined level, such as 3.3 Vdc. Once the output achieves the predetermined level, the MOSFET is then turned off. In another embodiment of PWM drive circuit 818, additional circuitry is included to generate the desired output signal, such as a boost or buck-boost circuit (not shown). Boost or buck-boost circuits are well-known in the art and require no further explanation. Upon reading this disclosure, a skilled artisan can understand how to implement the present invention in an exemplary DC-to-DC converter without undue experimentation.

While the above provides a detailed description of a specific embodiment of the present invention, there are other alternatives and modifications. For example, the duty cycle of the synchronized ramp signal and periodic system clock need not be 50% and can operate anywhere in the range from 0 to 100%. The scope of the invention is therefore not limited by the exemplary implementation described above, and is instead defined by the following claims.

What is claimed is:

1. A pulse width modulator comprising:
   a comparator coupled to receive a control signal and a reference ramp signal and configured to generate a pulse width control signal; and
   a noise suppression circuit coupled to receive a periodic signal and the pulse width control signal, and configured to provide a pulse width modulated signal, wherein a leading edge and a trailing edge of the periodic signal coincides with either a maximum or a minimum amplitude of the ramp signal.

2. The pulse width modulator of claim 1, wherein the reference ramp signal is a triangular waveform.

3. The pulse width modulator of claim 1, wherein reference ramp signal has a duty cycle of 50%.

4. The pulse width modulator of claim 1, wherein the pulse width modulated signal has a duty cycle in range from 0% to 100%.

5. The pulse width modulator of claim 1, the noise suppression circuit further comprising:
   a set logic path having a first set input coupled to the comparator output to receive the pulse width control signal and a second set input coupled to receive a periodic signal and a set output, the set output configured to provide an S-signal;
   a reset logic path having a first reset input coupled to receive a periodic signal and a second reset input coupled to receive the pulse width control signal and a reset output, the reset output configured to provide an R-signal; and
   a set-reset circuit latch having a first input coupled to the set output and a second input coupled to the reset output and a set-reset circuit output, wherein the set-reset circuit output is configured to provide the pulse width modulated signal.

6. The pulse width modulator of claim 5, wherein the set logic path further comprises:
   a first inverting logic gate coupled to receive the output from the comparator and configured to provide an inverted pulse width control signal; and
   a first NAND logic gate coupled to receive the inverted pulse width control signal and configured to receive the periodic signal, wherein the output of the first NAND logic gate is configured to provide the S-signal to the set input of the set-reset circuit latch.

7. The pulse width modulator of claim 6, wherein the reset logic path further comprises:
   a second inverting logic gate coupled to receive the periodic signal and configured to provide an inverted periodic signal; and
   a second NAND logic gate coupled to receive the inverted periodic signal and configured to receive the output from the comparator, wherein the output of the second NAND logic gate is configured to provide the R-signal to the reset input of the set-reset circuit latch.

8. The pulse width modulator of claim 1, the noise suppression circuit is configured further to alternate the states of the pulse width modulated signal during a periodic signal cycle, wherein the alternating states prevent a fault condition while the reference ramp signal is unequal to the control signal.

9. A method of generating a pulse width modulated signal comprising:

generating a reference ramp signal;

comparing the reference ramp signal to a control signal;

generating a pulse width control signal upon a predetermined event as a result of comparing the reference ramp signal to a control signal; and generating one leading edge and one trailing edge of the pulse width modulated signal for each cycle of the periodic signal based upon the pulse width control signal and a periodic signal, wherein the leading edge and the trailing edge are generated by a noise suppression circuit.

10. The method of claim 9, further comprising the step of repeating the previous steps for each of the predetermined events during each subsequent cycle of the periodic signal.

11. The method of claim 9, wherein the pulse width modulated signal has a duty cycle from 0% to 100%, where the duty cycle is ratio of the ON time of a signal to the duration of a full signal period.

12. The method of claim 9, further comprising the step of alternating the states of the pulse width modulated signal during each subsequent cycle of the periodic signal while the reference ramp signal is unequal to the control signal, wherein a fault condition of a system is prevented.

13. The method of claim 9, wherein the reference ramp signal is a triangular waveform.

14. The method of claim 9, wherein the control signal is a feedback error voltage control signal.

15. A battery charging system, having an adapter configured to convert a power signal to a DC power signal and a battery charger circuit coupled to receive the DC power signal from the adapter, the battery charger circuit comprising:

a signal generator configured to provide a reference ramp signal and a periodic signal;

a regulator coupled to regulate an electrical condition at a battery charger output;

a feedback circuit coupled to sense the electrical condition at the battery charger output and configured to provide a control signal; and a pulse width modulator coupled between the signal generator and the feedback circuit and configured to control the regulator, the pulse width modulator comprising:

a comparator coupled to receive the control signal and a reference ramp signal and configured to generate a pulse width control signal; and a noise suppression circuit coupled to receive the periodic signal and to an output of the comparator and configured to provide a pulse width modulated signal to the regulator, wherein a leading edge and a trailing edge of the periodic signal coincides with either a maximum or a minimum amplitude of the reference ramp signal;

wherein, the amount of regulation of the electrical conditions at the battery charger output is controlled by a width of a pulse of the pulse width modulated signal provided to the regulator.

* * * * *